(12) United States Patent
Lee

(10) Patent No.: US 7,074,711 B2
(45) Date of Patent: Jul. 11, 2006

(54) METHOD OF FABRICATING A TEST PATTERN FOR JUNCTION LEAKAGE CURRENT

(75) Inventor: Byeong Ryeol Lee, Seoul (KR)

(73) Assignee: Dongbu Electronics, Co., Ltd., Seoul (KR)

(*) Notice: Subject to any disclaimer, the term of this patent is extended or adjusted under 35 U.S.C. 154(b) by 0 days.

(21) Appl. No.: 11/027,349

(22) Filed: Dec. 29, 2004

(65) Prior Publication Data

US 2005/0142838 A1    Jun. 30, 2005

(30) Foreign Application Priority Data

Dec. 31, 2003 (KR) .................. 10-2003-0102042

(51) Int. Cl.
*H01L 21/4763* (2006.01)
(52) U.S. Cl. .................. 438/630; 438/17; 438/583; 438/682
(58) Field of Classification Search ............... 438/14, 438/17, 583, 630, 682
See application file for complete search history.

(56) References Cited

U.S. PATENT DOCUMENTS

| 5,451,529 | A | | 9/1995 | Hsu et al. |
| 6,037,607 | A | * | 3/2000 | Hause et al. .................. 257/48 |
| 6,114,226 | A | * | 9/2000 | Chang et al. ................ 438/510 |
| 6,165,807 | A | | 12/2000 | Lee et al. |
| 6,350,636 | B1 | | 2/2002 | Lee et al. |

OTHER PUBLICATIONS

S. Wolf, Silicon Processing for the VLSI Era, 1990, vol. 2, p. 154.*

* cited by examiner

*Primary Examiner*—Bradley K. Smith
*Assistant Examiner*—Douglas M. Menz
(74) *Attorney, Agent, or Firm*—Saliwanchik, Lloyd & Saliwanchik

(57) ABSTRACT

A method of forming a salicide pattern for measuring junction leakage current is disclosed. An example method forms device isolation structures on a silicon substrate, forms a well region between the device isolation structures, forms source and drain regions on the well region, and forms a salicide layer on the source and drain regions. The example method also removes some part of the salicide layer, deposits an interlayer dielectric layer on the salicide layer, and forms via holes in the interlayer dielectric layer and filling metal into the via holes to form a via. The example method further planarizes the interlayer dielectric layer and the via, and forms metal interconnects on the interlayer dielectric layer.

2 Claims, 6 Drawing Sheets

METHOD OF FABRICATING A TEST PATTERN FOR JUNCTION LEAKAGE CURRENT

TECHNICAL FIELD

The present disclosure relates to a test pattern for a junction leakage current and, more particularly, to a method of forming a salicide pattern for measuring junction leakage current.

BACKGROUND

Generally, known metal-oxide-metal (MOS) transistors have relatively high sheet resistance at the interface between metal interconnects. The high sheet resistance causes high power consumption and delivers a great deal of heat into the integrated circuit formed thereby, which may affect the operational characteristics of the integrated circuit. Accordingly, to reduce the high sheet resistance, a method that forms a silicide layer on source and drain regions and a gate electrode has been developed. In the known method of forming the silicide layer, a metal layer such as Ti that can chemically react with silicon is first deposited on a gate electrode and spacers as well as on source and drain regions. While a thermal treatment for the metal layer is carried out one or two times, the metal layer chemically reacts with polysilicon of the gate or silicon of the source or the drain so that the silicide layer is formed and the remainder of the metal layer that has not reacted with anything is removed by an etching process.

The foregoing method is called a self-aligned silicide (hereinafter referred to as "salicide") process because a silicide layer is formed without any mask process defining where the silicide layer will be formed. The salicide layer formed using the forgoing method greatly affects the standby current characteristics of a semiconductor device as well as characteristics of its leakage current, which vary based on deposition thickness. Therefore, it is important to analyze the characteristics of the junction leakage current due to the salicide process.

FIGS. 1a through 2c are views illustrating examples of known test patterns for measuring the junction leakage current due to the salicide layer. FIG. 1a is a top view illustrating a test pattern of area type, and FIG. 1b and FIG. 1c are cross-sectional views illustrating test patterns taken along the line A-A' and the line B-B', respectively.

FIG. 2a is a top view illustrating a test pattern of peripheral type, and FIG. 2b and FIG. 2c are cross-sectional views illustrating test patterns taken along the line A-A' and the line B-B', respectively. Both test patterns of area type and peripheral type are identical except that they are distinguished by the number of shallow trench isolation (hereinafter referred to as "STI") structures or device isolation structures formed along the line B-B'.

The processes for forming the salicide pattern described above are now described. Referring to FIG. 1b, an STI 2 for device isolation is defined in a silicon substrate 1 of a predetermined impurity type. A well region (not shown) is formed by implanting impurities identical to the substrate type. An active region 3 including source and drain regions is formed by implanting impurities opposite to the type of impurities implanted in the well. A salicide layer 4 is formed on the entire surface of the active region 3 and an interlayer dielectric layer 5 is deposited on the entire surface of the substrate. After a photoresist pattern (not shown) is formed to expose the region where via holes will be formed, the interlayer dielectric layer 5 is dry-etched by using the photoresist pattern as a mask, so that via holes 6 are completed and the salicide layer 4 is exposed. Next, the via holes 6 are filled with a predetermined conductive metal and planarized. Metal interconnects 7 are formed on the interlayer dielectric layer including the via holes so that a test pattern is completed.

However, if the junction leakage current is measured by the test pattern, the junction leakage current from the salicide layer itself is difficult to measure because the salicide layer exists through the whole active region and comes in contact with the edge (the dotted region in FIG. 2c) of the STI, which is greatly affected by a leakage current.

DETAILED DESCRIPTION

Figure 1A:
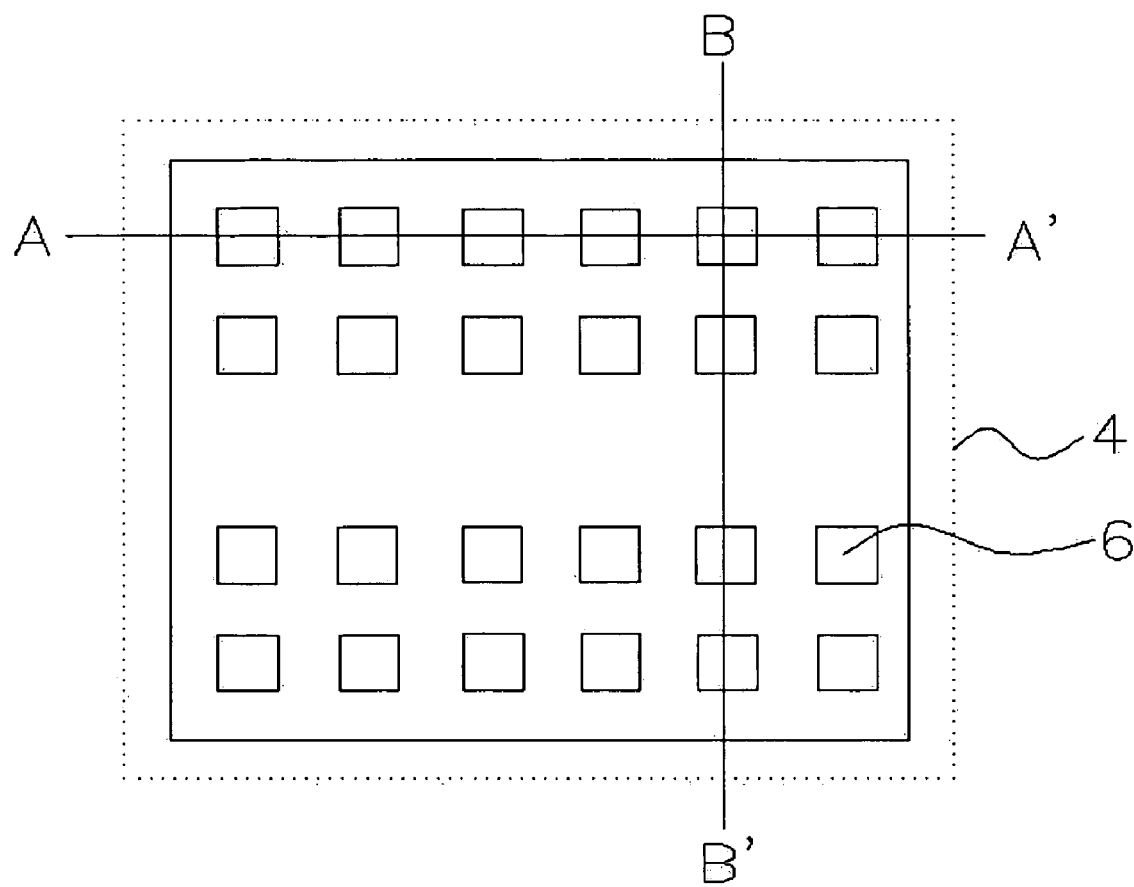
FIG. 1a is a top view illustrating a known test pattern of area type for measuring the junction leakage current.
Figure 1B:
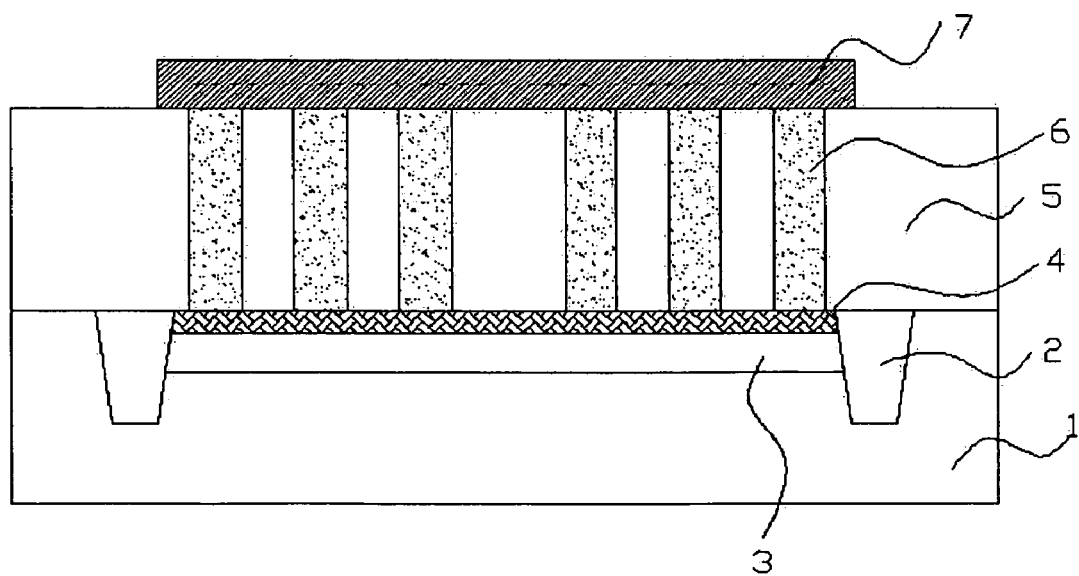
FIG. 1b and FIG. 1c are cross-sectional views illustrating known test patterns of area type for measuring the junction leakage current.
Figure 1C:
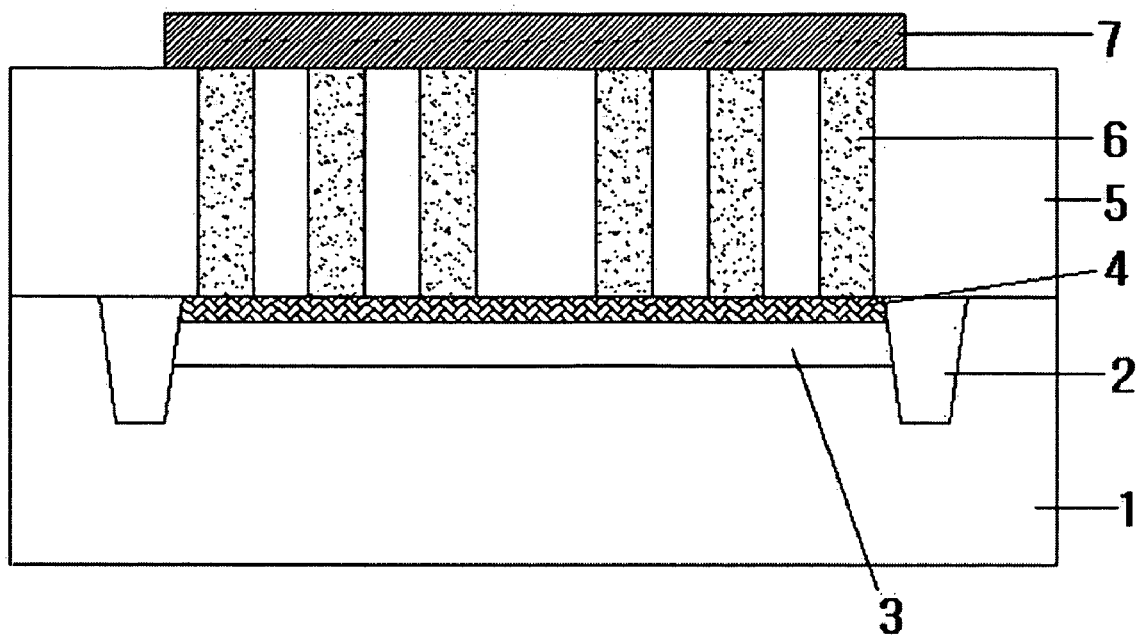
Figure 2A:
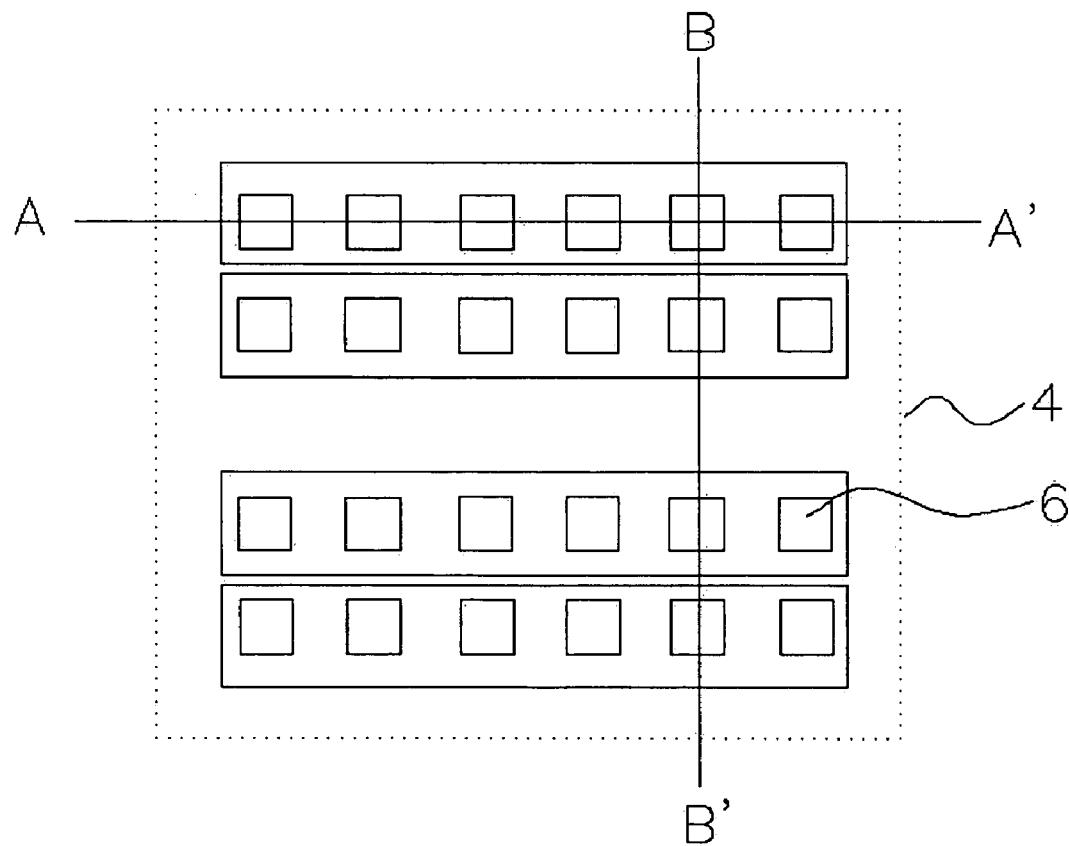
FIG. 2a is a top view illustrating a known test pattern of peripheral type for measuring the junction leakage current.
Figure 2B:
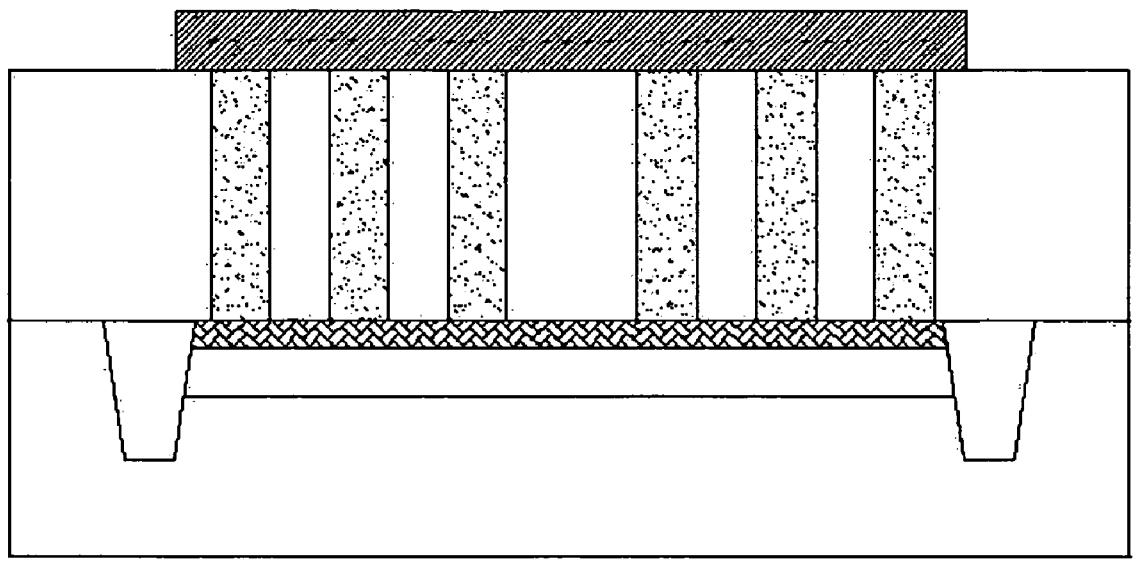
FIG. 2b and FIG. 2c are cross-sectional views illustrating known test patterns of peripheral type for measuring the junction leakage current.
Figure 2C:
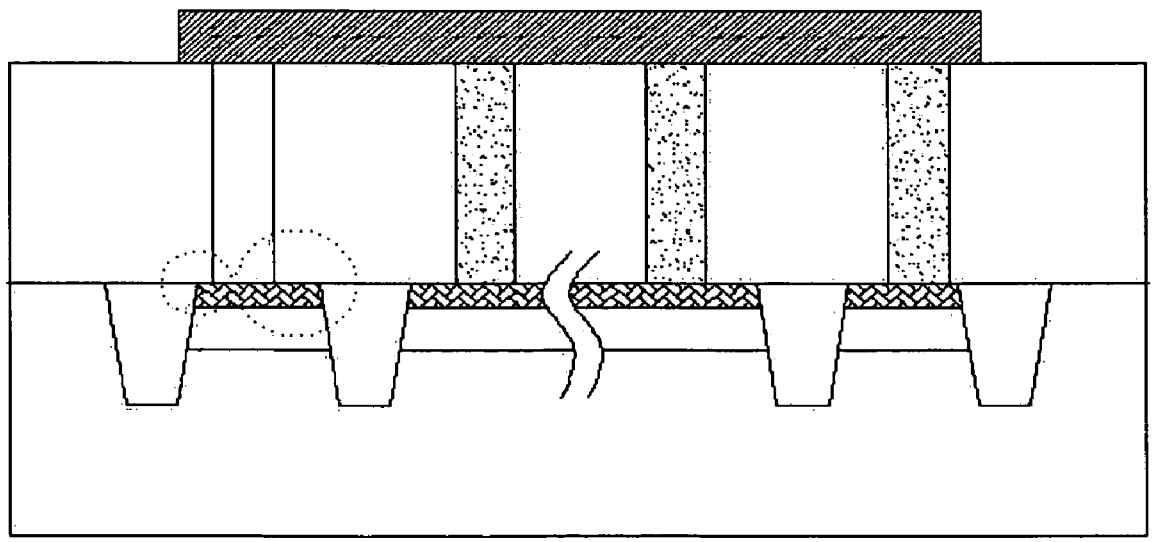
Figure 3A:
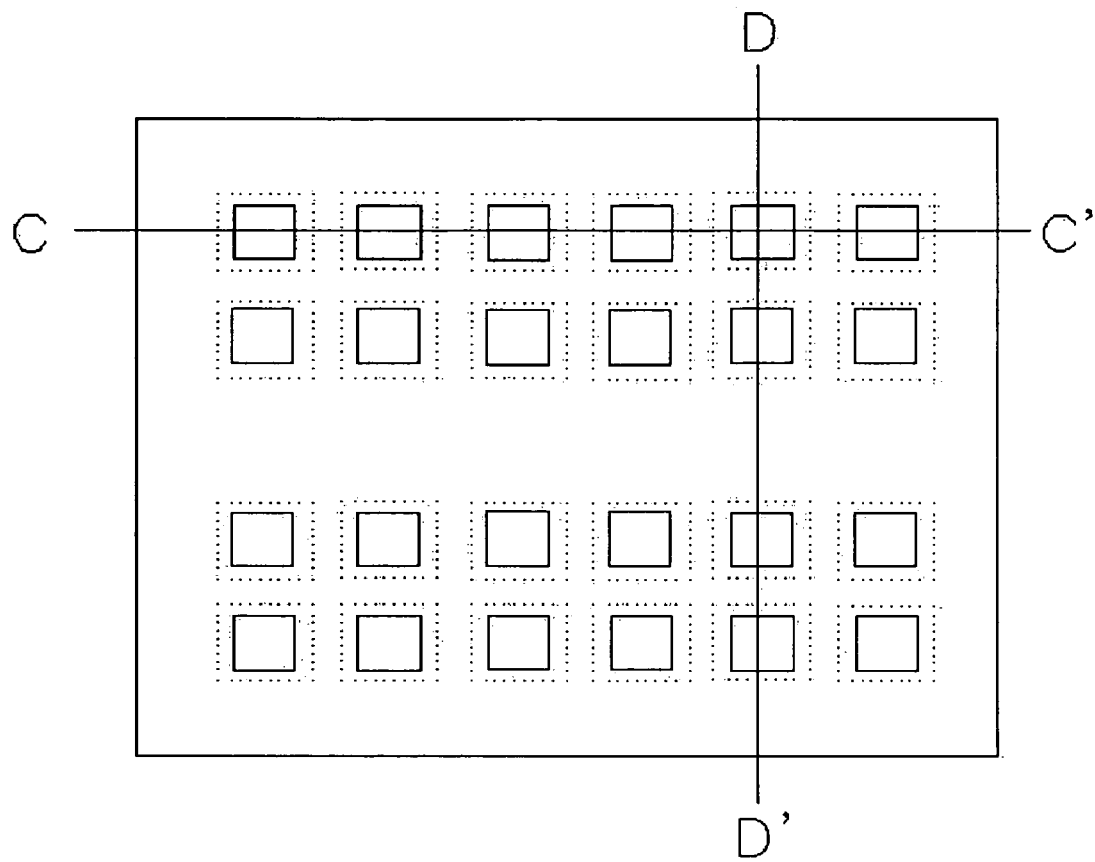
FIG. 3a is a top view illustrating an example test pattern of area type for measuring the junction leakage current.
Figure 3B:
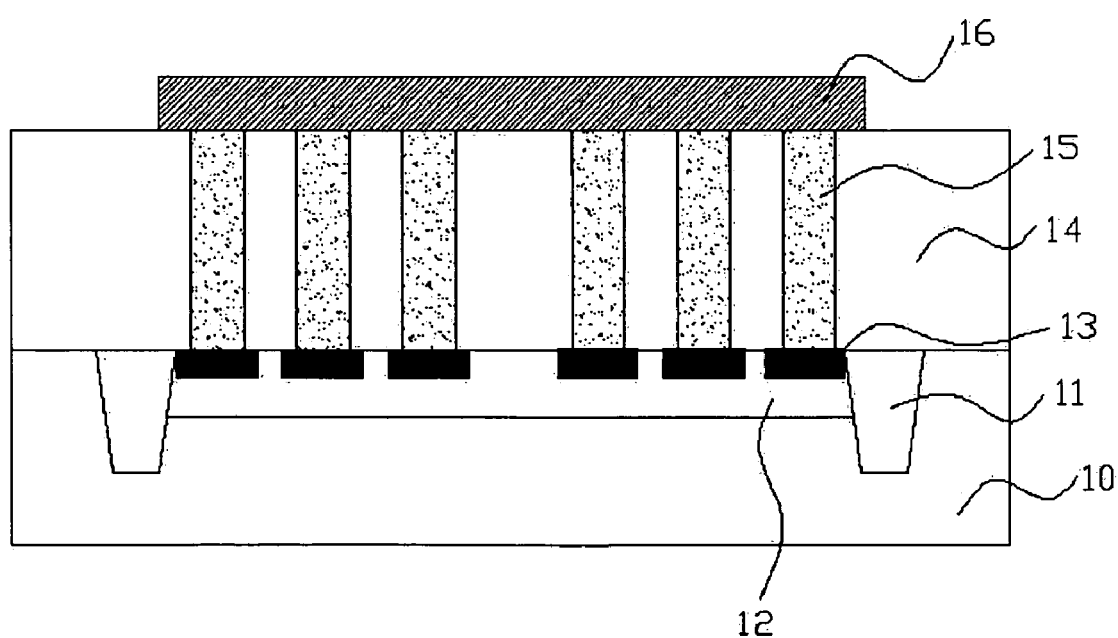
FIG. 3b and FIG. 3c are cross-sectional views illustrating example test patterns of area type for measuring the junction leakage current.
Figure 3C:
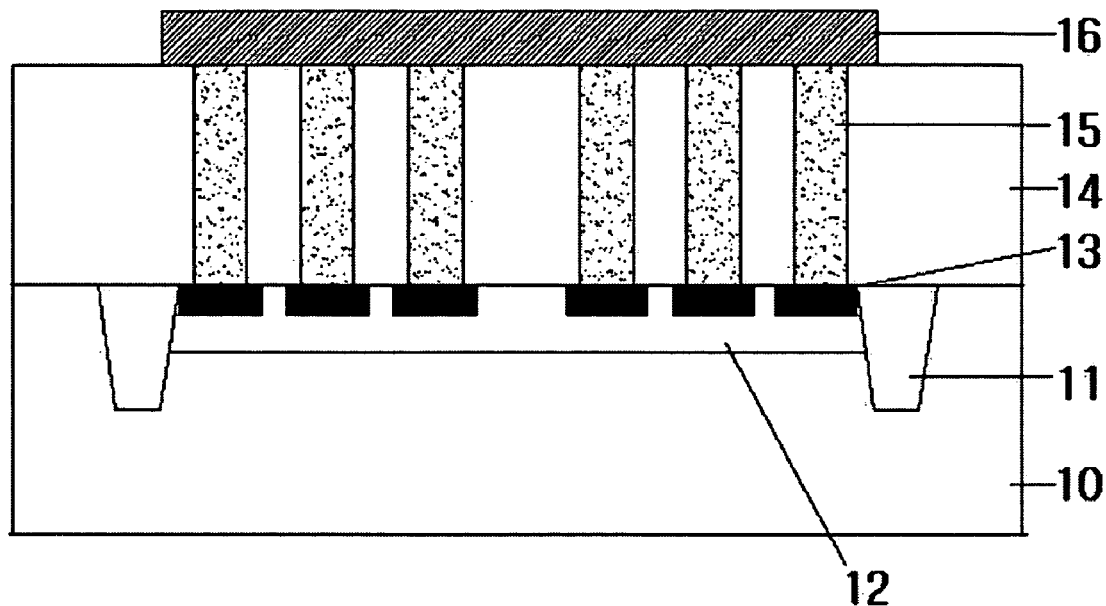
Figure 4A:
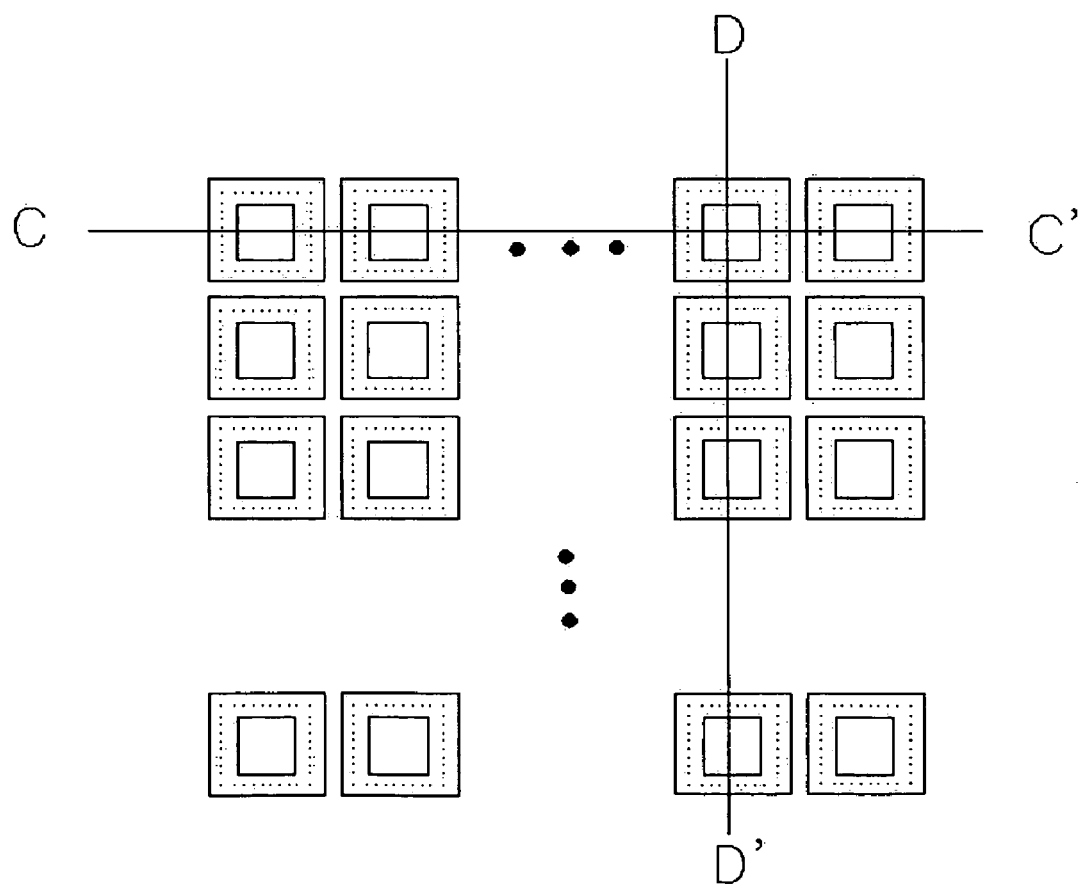
FIG. 4a is a top view illustrating an example test pattern of peripheral type for measuring the junction leakage current.

FIG. 3a and FIG. 4a are top views illustrating examples of test patterns for measuring the junction leakage current caused by the salicide layer. FIG. 3a is a top view illustrating an example test pattern of area type, and FIG. 3b and FIG. 3c are cross-sectional views illustrating example test patterns taken along the line C-C' and the line D-D', respectively.

Figure 4B:
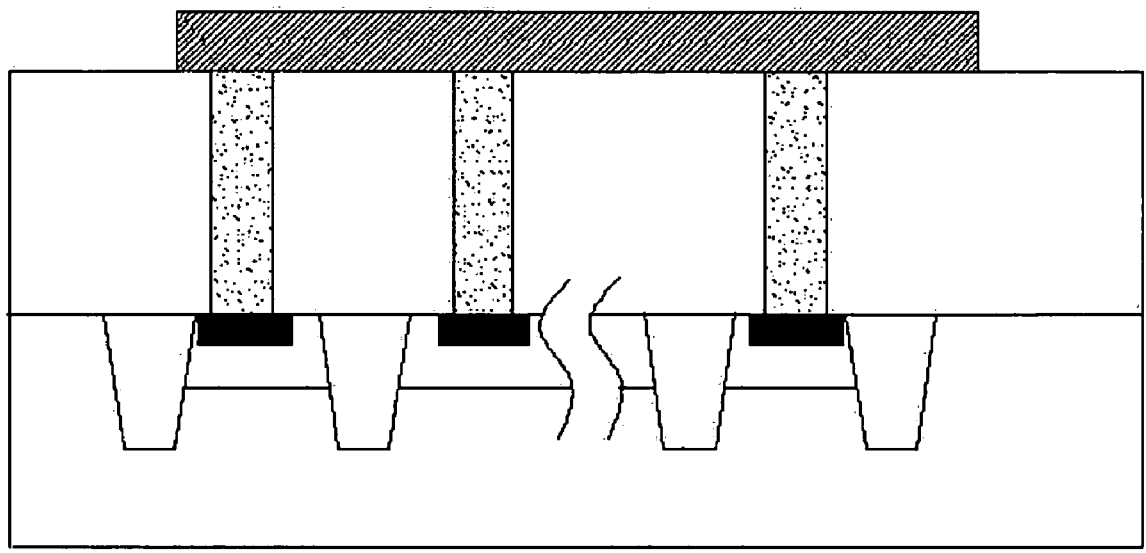
FIG. 4b and FIG. 4c are cross-sectional views illustrating example test patterns of peripheral type for measuring the junction leakage current.
Figure 4C:
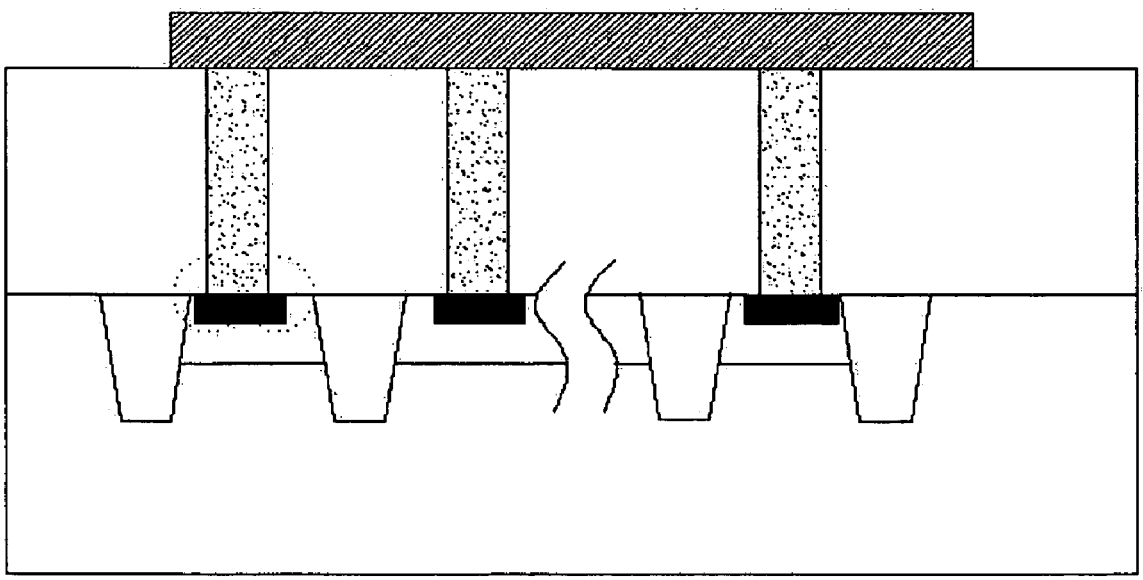

FIG. 4a is a top view illustrating an example test pattern of peripheral type, and FIG. 4b and FIG. 4c are cross-sectional views illustrating example test patterns taken along the line C-C' and the line D-D', respectively. The test patterns of area type and peripheral type are identical except that they are distinguished by the number of STI structures or device isolation structures formed along the line D-D'.

The processes for forming the salicide pattern are as follows. Referring to FIG. 3b, STIs 11 for device isolation are defined in a silicon substrate 10 of a predetermined impurity type. A well region (not shown) is formed between the device isolation structures by implanting impurities identical to the substrate type. An active region 12 including source and drain regions is formed on the well region by implanting impurities opposite to those implanted in the well. For the source and drain regions, an N-type junction is formed by implanting $^{31}P$ ions or $^{75}As$ ions, or a P-type junction is formed by implanting $^{11}B$ ions or $BF_2$ ions.

A salicide layer (not shown) is formed on the entire surface of the active region 12. After a mask pattern (not shown) is formed so that the salicide layer remains only in the lower region of via holes, i.e. via contact region, some part of the salicide layer is removed through an etching process using the mask pattern as an etch mask. Next, an interlayer dielectric layer 14 is deposited on the entire surface of the substrate including the salicide layer 13. After a photoresist pattern (not shown) is formed to expose the region where via holes will be formed, the interlayer dielectric layer 14 is dry-etched by using the photoresist pattern as a mask, so that via holes 15 are completed and the salicide layer 13 is exposed. Next, the via holes 15 are filled with a predetermined conductive metal to form a via. The interlayer dielectric layer 14 and the via are planarized. Metal interconnects 16 are formed on the interlayer dielectric layer including the via holes, so that a test pattern is completed.

Accordingly, the disclosed method forms the salicide pattern selectively in the via contact region. Therefore, the junction leakage current from the salicide layer itself is measured excluding that from the edge of the device isolation structure. Product failure analysis can be easily done and a quick feedback based on the analysis is accomplished so that yield of semiconductor devices is improved.

It is noted that this patent claims priority from Korean Patent Application Serial Number 10-2003-0102042, which was filed on Dec. 31, 2003, and is here by incorporated by reference in its entirety.

While the examples herein have been described in detail with reference to example embodiments, it is to be understood that the coverage of this patent is not limited to the disclosed embodiments, but, on the contrary, is intended to cover various modifications and equivalent arrangements included within the spirit and scope of the appended claims.

What is claimed is:

1. A method of fabricating a test pattern for measuring a junction leakage current comprising:

forming device isolation structures on a silicon substrate;

forming a well region between the device isolation structures;

forming source and drain regions on the well region;

forming a salicide layer on the source and drain regions;

removing some part of the salicide layer;

depositing an interlayer dielectric layer on the salicide layer;

forming via holes in the interlayer dielectric layer and filling metal into the via holes to form a via;

planarizing the interlayer dielectric layer and the via; and forming metal interconnects on the interlayer dielectric layer, wherein the salicide layer is selectively formed only in the via contact region of the via holes; whereby a test pattern for measuring a junction leakage current is fabricated.

2. A method as defined by claim 1, wherein the source and drain regions are formed by implanting $^{31}P$ ions or $^{75}As$ ions for an N-type junction, or by implanting $^{11}B$ ions or $BF_2$ ions for a P-type junction.

* * * * *